US012785048B2

(12) United States Patent
Umehara et al.

(10) Patent No.: US 12,785,048 B2
(45) Date of Patent: Nov. 3, 2026

(54) PLASMA-RESISTANT LAMINATE, MANUFACTURING METHOD THEREFOR, AND PLASMA PROCESSING APPARATUS

(71) Applicant: KYOCERA Corporation, Kyoto (JP)

(72) Inventors: Motohiro Umehara, Yasu (JP); Wataru Fujita, Higashiomi (JP); Kazuhiro Ishikawa, Gamo-gun (JP)

(73) Assignee: Kyocera Corporation, Kyoto (JP)

( * ) Notice: Subject to any disclaimer, the term of this patent is extended or adjusted under 35 U.S.C. 154(b) by 210 days.

(21) Appl. No.: 18/687,553

(22) PCT Filed: Aug. 31, 2022

(86) PCT No.: PCT/JP2022/032839
§ 371 (c)(1),
(2) Date: Feb. 28, 2024

(87) PCT Pub. No.: WO2023/033067
PCT Pub. Date: Mar. 9, 2023

(65) Prior Publication Data
US 2025/0006468 A1 Jan. 2, 2025

(30) Foreign Application Priority Data
Aug. 31, 2021 (JP) ................................ 2021-141949

(51) Int. Cl.
*H01J 37/32* (2006.01)
*C23C 14/18* (2006.01)
*C23C 14/58* (2006.01)

(52) U.S. Cl.
CPC ...... *H01J 37/32477* (2013.01); *C23C 14/185* (2013.01); *C23C 14/5853* (2013.01)

(58) Field of Classification Search
CPC ........... H01J 37/32477; H01J 37/32495; H01J 37/3255; H01J 37/32715; H01J 37/32935;
(Continued)

(56) References Cited

U.S. PATENT DOCUMENTS

2005/0152089 A1* 7/2005 Matsuda ................ H02N 13/00 361/234
2005/0194094 A1 9/2005 Yasaka
(Continued)

FOREIGN PATENT DOCUMENTS

JP 11-61404 A 3/1999
JP 3426845 B2 * 7/2003
(Continued)

OTHER PUBLICATIONS

Ip.com translation of JP3426845B2 (Year: 2025).*
(Continued)

*Primary Examiner* — Michael Zhang
(74) *Attorney, Agent, or Firm* — Procopio, Cory, Hargreaves & Savitch LLP

(57) ABSTRACT

A plasma-resistant laminate of the present disclosure includes a substrate, a membrane electrode formed on the substrate, and a dielectric layer formed on the membrane electrode, the substrate includes sapphire, the dielectric layer includes an oxide including yttrium, and the membrane electrode is made of an active metal, a constituent element of the substrate or the dielectric layer, or a laminate thereof.

14 Claims, 3 Drawing Sheets

(58) Field of Classification Search

CPC ........ H01J 2237/3321; H01J 2237/334; C23C 14/185; C23C 14/5853; C23C 14/08; C23C 14/06; C23C 14/083; C23C 16/44; H05H 1/2441

See application file for complete search history.

(56) References Cited

U.S. PATENT DOCUMENTS

| | | | | |
|---|---|---|---|---|
| 2007/0058322 | A1 | 3/2007 | Ito et al. | |
| 2016/0336210 | A1 | 11/2016 | Cooke et al. | |
| 2017/0140970 | A1* | 5/2017 | Boyd, Jr. | H10P 72/722 |
| 2018/0269097 | A1* | 9/2018 | Maeta | H01J 37/32642 |
| 2020/0095687 | A1 | 3/2020 | Park et al. | |
| 2020/0227300 | A1 | 7/2020 | Lee et al. | |

FOREIGN PATENT DOCUMENTS

| | | | |
|---|---|---|---|
| JP | 2003-318115 | A | 11/2003 |
| JP | 2007-73309 | A | 3/2007 |
| JP | 2011-228386 | A | 11/2011 |
| JP | 2017-507484 | A | 3/2017 |
| JP | 2020-174137 | A | 10/2020 |
| KR | 10-2018-0129366 | A | 12/2018 |
| KR | 10-2020-0089584 | A | 7/2020 |

OTHER PUBLICATIONS

Waferworld, "Silicon Wafer | Silicon Wafer and its Different Diameters", https://www.waferworld.com/post/silicon-wafer-silicon-wafer-and-its-different-diameters, Aug. 15, 2019 (Year: 2019).*

* cited by examiner

CENTER PORTION

OUTER PERIPHERAL PORTION

PLASMA-RESISTANT LAMINATE, MANUFACTURING METHOD THEREFOR, AND PLASMA PROCESSING APPARATUS

TECHNICAL FIELD

The present disclosure relates to a plasma-resistant laminate, a manufacturing method therefor, and a plasma processing apparatus.

BACKGROUND OF INVENTION

In the field of semiconductor manufacturing, for the purpose of plasma chemical vapor deposition (CVD), ashing, etching, sputtering, other surface treatments, and the like, a method of performing plasma processing on an object to be processed such as a semiconductor substrate by using plasma discharge is widely used.

In a plasma processing step of performing plasma processing, when applying a high voltage or a high-frequency voltage of a high-frequency power source, electronic element characteristics of an object to be processed may deteriorate due to poor stability of plasma such as occurrence of abnormal discharge. In order to cope with such a problem, a plasma state in a plasma processing chamber needs to be accurately detected.

Known plasma measuring instruments for detecting a plasma state include a Langmuir probe for measuring a plasma state such as a space potential from current-voltage characteristics obtained by inserting a probe-like electrode with an exposed tip into plasma and applying a voltage, a capacitive probe for measuring a plasma state such as a space potential from capacitance obtained by covering an electrode with an insulator, and the like.

Examples of plasma measuring instruments proposed in the related art include those disclosed in Patent Documents 1 to 3. That is, Patent Document 1 proposes a plasma monitoring apparatus using a window-type probe. Patent Document 2 proposes a plasma processing apparatus including a signal detection part that detects a sign signal for capturing the occurrence of abnormal discharge of plasma in advance, and a control part that controls an ESC leakage current on the basis of the sign signal.

Patent Document 3 proposes a plasma processing apparatus in which a probe base is installed on a side wall of a processing chamber, pulsed bias power is applied to the base, a voltage change of a capacitor is analyzed, and a state of an inner wall of the processing chamber and an internal state of plasma are monitored in real time, and the control of a processing method of the plasma processing apparatus from data values thereof.

CITATION LIST

Patent Literature

Patent Document 1: JP 2003-318115 A
Patent Document 2: JP 2007-73309 A
Patent Document 3: JP 2011-228386 A

SUMMARY

A plasma-resistant laminate of the present disclosure includes a substrate, a membrane electrode formed on the substrate, and a dielectric layer formed on the membrane electrode, the substrate includes sapphire, the dielectric layer includes an oxide including yttrium, and the membrane electrode is made of an active metal, a constituent element of the substrate or the dielectric layer, or a laminate thereof.

A method for manufacturing a plasma-resistant laminate of the present disclosure includes: polishing a surface of a substrate so that an arithmetic mean height Sa is 0.01 μm or less; forming a membrane electrode on the substrate; and forming a dielectric layer by repeating film formation and oxidation of a metal material.

In a plasma processing apparatus of the present disclosure, a capacitive probe type plasma sensor including the above plasma-resistant laminate is mounted in a plasma processing chamber.

DESCRIPTION OF EMBODIMENTS

Figure 1:
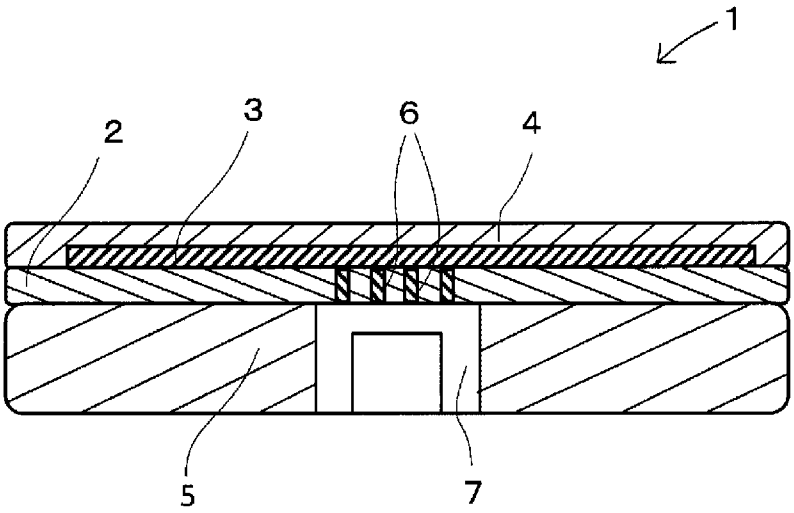
FIG. 1 is a schematic cross-sectional view illustrating a plasma-resistant laminate according to an embodiment of the present disclosure.

A plasma-resistant laminate according to an embodiment of the present disclosure is described below. FIG. 1 is a schematic cross-sectional view illustrating a plasma-resistant laminate 1 according to the present embodiment. The plasma-resistant laminate 1 serves as a capacitive probe type plasma sensor.

As illustrated in FIG. 1, the plasma-resistant laminate 1 includes a substrate 2, a membrane electrode 3 formed on the substrate 2, and a dielectric layer 4 formed on the membrane electrode 3.

The substrate 2 includes sapphire and the dielectric layer 4 includes an oxide including yttrium. Sapphire has excellent plasma resistance and mechanical strength. Yttria ($Y_2O_3$) being an oxide of yttrium has better plasma resistance than sapphire.

Since sapphire is a single crystal, the surface can be processed to be smooth, so that the membrane electrode 3 and the dielectric layer 4 that are thin and have few defects such as voids can be formed, and as a result, the capacitance obtained from (area×dielectric constant/thickness) can be increased.

While the average coefficient of linear thermal expansion ($10^{-6}$/K) at 40° C. to 400° C. of yttria constituting the dielectric layer 4 is 7.2, the average coefficient of thermal expansion of sapphire constituting the substrate 2 is 7.7 in a direction parallel to a c-axis and is 7.0 in a direction perpendicular to the c-axis. Therefore, the difference in thermal expansion between the dielectric layer 4 and the substrate 2 is small, and peeling or cracking due to thermal stress is unlikely to occur.

The membrane electrode 3 is made of an active metal, a constituent element of the substrate 2 or the dielectric layer 4, or a laminate thereof. The active metal is a metal that is more likely to be bonded to an oxygen atom of an oxide constituting the substrate 2 and has higher adhesion than an inert metal such as copper, silver, or gold. Typical active metals include alkaline earth metals, rare earth metals, and group 4 to group 6 element metals and group 13 and group 14 element metals in a periodic table. In particular, titanium, zirconium, hafnium, vanadium, and chromium have high adhesion to sapphire, and have a relatively small difference in the coefficient of thermal expansion from sapphire as a metal. Since yttrium is a constituent element of yttria constituting the dielectric layer 4 and the dielectric layer 4 can be continuously formed by oxidizing a surface of yttrium, an improvement in adhesion to the dielectric layer 4 can be expected. Aluminum is a constituent element of sapphire constituting the substrate 2, and an improvement in adhesion to the substrate 2 utilizing diffusion of aluminum atoms by heat treatment can be expected. The fact that the membrane electrode 3 is a laminate of an active metal formed on the substrate 2 and yttrium formed on the active metal is particularly preferable because both the adhesion to the substrate 2 and the adhesion to the dielectric layer 4 are enhanced.

Preferably, the membrane electrode 3 has a thickness from 0.5 μm to 5 μm, and the dielectric layer 4 has a thickness from 0.5 μm to 5 μm from a surface of the membrane electrode 3 and an area of 1000 $mm^2$ or more. Since the membrane electrode 3 is thin in this way, the membrane electrode 3 can be covered with the thin dielectric layer 4, and the capacitance (area×dielectric constant/thickness) can be increased. Specifically, the plasma-resistant laminate of the present embodiment preferably has a capacitance of 1 nF or more.

A surface of the substrate 2 is preferably a c-plane of sapphire. Since the substrate 2 is thicker than the membrane electrode 3 and the dielectric layer 4, the deformation and stress of the substrate 2 greatly affect the deformation and stress of the plasma-resistant laminate 1. Since the c-plane has no anisotropy in the coefficient of thermal expansion and Young's modulus, the c-plane has an advantage in that deformation at the time of temperature change is small.

The dielectric layer 4 has a compressive stress in a direction perpendicular to a thickness direction depending on the formation method. The direction perpendicular to the thickness direction is a direction parallel to a surface of the dielectric layer 4. For example, as will be described below, in a post-oxidation sputtering method, since an oxide film (dielectric layer 4) is formed by repeating film formation and oxidation of a metal (yttrium), the interatomic distance increases during oxidation. At this time, a compressive stress is considered to be generated in the dielectric layer 4 because the direction perpendicular to the thickness direction is constrained by the substrate 2.

The stress in the direction perpendicular to the thickness direction of the dielectric layer 4 can be measured using an X-ray diffraction apparatus. Stresses in two directions parallel to the surface and orthogonal to each other are evaluated at a plurality of points (for example, five points) in the plane, and respective average values are defined as σ11 and σ22. Since the dielectric layer 4 has a small thickness, cracks are likely to occur when a tensile stress is applied in the direction perpendicular to the thickness direction. Therefore, σ1, which is an average value of the stress σ11 and the stress σ22, may be a compressive stress. In this case, both σ11 and σ22 may be particularly compressive stresses. Since distortion is likely to occur when the difference between σ11 and σ22 is large, σ22/σ11 is preferably from 0.5 to 2, more preferably from 0.8 to 1.2.

The average value σ1 of the stresses σ11 and σ22 may be from 200 MPa to 1000 MPa. When σ1 is equal to or greater than 200 MPa, the hardness is maintained, and consequently the occurrence of particles, cracks, and the like can be reduced. On the other hand, when σ1 is too large, since deformation and cracks are likely to occur and a joining strength is also likely to decrease, σ1 may be equal to or less than 1000 MPa.

As described above, the coefficient of thermal expansion of sapphire is greater than the coefficient of thermal expansion of yttria in the direction parallel to the c-axis and smaller than the coefficient of thermal expansion of yttria in the direction perpendicular to the c-axis. Therefore, σ1 can be adjusted by selecting the crystal orientation of sapphire used as the substrate 2. For example, when σ1 is a compressive stress as in the embodiment of the present invention, the surface of the substrate 2 facing the dielectric layer 4 is preferably made of sapphire having a plane (c-plane) perpendicular to the c-axis and the substrate 2 is preferably used in a lower temperature environment than when the dielectric layer 4 is formed because al is relaxed (σ1 does not become too large) due to the difference in thermal expansion between the substrate 2 and the dielectric layer 4. When a difference occurs between σ11 and σ22, for example, when the shape of the substrate 2 is a rectangle having a long (long side) direction and a short (short side) direction, the surface of the substrate 2 facing the dielectric 4 may be made of sapphire having a plane (a-plane, m-plane, or the like) parallel to the c-axis, and the orientation of sapphire may be selected so that the direction in which a large compressive stress is likely to occur (for example, the long side of the rectangle) is perpendicular to the c-axis. "Perpendicular" or "parallel" to the c-axis need not to be completely perpendicular or parallel to the c-axis, and may be within +15°, for example.

The dielectric layer 4 is preferably made of columnar grains that are long in the thickness direction. In particular, lengths of the grains in the thickness direction are preferably substantially the same as the thickness of the dielectric layer 4. The average grain size of the surface of the dielectric layer 4 is preferably from 0.01 μm to 0.5 μm, and the average aspect ratio (long axis/short axis) of the grains is preferably 2 or more. When the average grain size is 0.01 μm or more on the surface of the dielectric layer 4, which is most exposed to plasma, the ratio of the crystal grain boundary is reduced and plasma resistance is improved. When the columnar grains are long in the thickness direction, the number of crystal grain boundaries crossing an electric field direction is reduced, and measurement accuracy is improved. This enables high dielectric performance and plasma resistance. The dielectric layer 4 made of columnar grains can be formed using, for example, a post-oxidation sputtering apparatus. The average grain size of the grains can be calculated by obtaining a surface observation image in a range of, for example, 9×12 μm using a scanning electron microscope (SEM) or the like, drawing six straight lines having the same length, for example, 6 μm, radially around an arbitrary point, and dividing the total length of the six straight lines by the total number of crystals existing on these straight lines.

The dielectric layer 4 may have vertically long pores in which the length in the thickness direction is longer than the length in the direction orthogonal to the thickness direction when a cross section cut along the thickness direction is observed. When the dielectric layer 4 has the vertically long pores as described above, the area ratio occupied by the pores when the dielectric layer 4 is viewed in the thickness direction can be reduced, and a decrease in capacitance due to the pores can be reduced to improve measurement accuracy. The stress generated in the dielectric layer 4 can be effectively relaxed by the pores while the capacitance in the thickness direction of the dielectric layer 4 is appropriately maintained to improve the measurement accuracy. The dielectric layer 4 having the vertically long pores can be formed by repeating film formation a plurality of times by using, for example, a post-oxidation sputtering apparatus. In the dielectric layer 4 having the vertically long pores, the area ratio occupied by the pores in the cross section cut along the thickness direction may be from 0.05 area % to 8 area %.

Light with various wavelengths is generated in a plasma generator. Light with a wavelength of 400 nm or less is called ultraviolet light, and light with a wavelength of 700 nm or more is called infrared light. Infrared light is absorbed by a substance, causing heat generation (increase in lattice vibration). The dielectric layer 4 is heated, there is a concern that characteristics of an element using the dielectric layer 4 may change due to a change in resistivity or the like caused by heat generation of carriers (electrons). Ultraviolet light causes deterioration of various substances such as polymers. When the dielectric layer 4 absorbs ultraviolet light, a part of the ultraviolet light is changed to light with another wavelength and the reflection and transmission of the ultraviolet light are reduced, so that the influence of the ultraviolet light on surrounding members is reduced as compared with when the reflectance of the ultraviolet light is high. Therefore, in the dielectric layer 4, the reflectance of light with a wavelength of 400 nm or less may be 50% or less, more preferably 30% or more. In the dielectric layer 4, the reflectance of light with a wavelength of 700 nm or more may be 50% or more, more preferably 60% or more. When the reflectance of light with a wavelength of 400 nm or less is 50% or less, preferably 30% or more, the reflectance of ultraviolet light is low, so that deterioration of other components exposed to plasma light inside and outside the apparatus, particularly organic components that may be deteriorated by the ultraviolet light, can be reduced. When the reflectance of light with a wavelength of 700 nm or more is 50% or more, preferably 60% or more, the reflectance of infrared rays is high, so that the temperature rise of the film surface is suppressed and changes in element sensitivity due to plasma irradiation is reduced.

As illustrated in FIG. 1, the substrate 2 is formed on a surface of a support layer 5. Examples of the support layer 5 that can be used include alumina ceramic. Since alumina ceramic is the same material as sapphire, it has a small difference in physical properties such as the coefficient of thermal expansion and can be produced at a lower cost than sapphire. The substrate 2 and the support layer 5 may be bonded to each other by using, for example, an epoxy-based adhesive or a silicone-based adhesive, or the like, or may be directly bonded to each other by diffusion bonding or the like. A power supply terminal 7 for power supply and measurement is provided on the support layer 5. Note that the support layer 5 may be provided as needed and the substrate 2 and the support layer 5 may be integrally formed using sapphire.

The substrate 2 has a plurality of via electrodes 6 electrically connected to the membrane electrode 3. The via electrode 6 can be formed by performing copper plating or the like in a through hole provided in the substrate 2. The via electrode 6 preferably has diameter from 30 μm to 200 μm.

When a step exists between the via electrode 6 and the substrate 2, the electrical connection with the membrane electrode 3 may be damaged (disconnected). Therefore, in the present embodiment, the step between the via electrode 6 and the substrate 2 is preferably adjusted to be 1.0 μm or less, more preferably 0.2 μm or less by surface polishing. Thus, the surface smoothness and the film thickness distribution of the dielectric layer 4 can be maintained with very high accuracy without variations.

The membrane electrode 3 is electrically connected to the power supply terminal 7 of the support layer 5 through the via electrodes 6. Thus, the membrane electrode 3 serves as a probe for plasma measurement, and a space potential indicating a plasma state can be measured.

A method for manufacturing the plasma-resistant laminate of the present disclosure is described below. The plasma-resistant laminate of the present disclosure can be manufactured by the following steps.

Polishing Step of Substrate 2

The surface of the substrate 2 including sapphire is polished so that an arithmetic mean height Sa is 0.1 μm or less, preferably 10 nm or less. The plurality of via electrodes 6 described above are formed on the substrate 2 in advance. The polishing may be performed by, for example, lapping using diamond abrasive grains and a surface plate and chemical mechanical polishing (CMP) using colloidal silica abrasive grains and alkaline slurry.

The arithmetic mean height Sa is a parameter of surface properties defined in ISO25178-6:2010, and is a parameter obtained by extending an arithmetic average roughness Ra of a line to a plane. Specifically, the arithmetic mean height Sa represents an average of absolute values of differences in height between points on a target surface with respect to an average surface of a surface to be measured. Sa represents the average of the absolute values of the differences in height between the points on the target surface with respect to the average surface of the surface to be measured.

The substrate 2 includes a sapphire single crystal. The surface of the substrate 2 is preferably the c-plane of sapphire in order to reduce the difference in thermal expansion between the substrate 2 and the dielectric layer 4. The thickness of the substrate 2 is designed so that the plasma-resistant laminate 1 satisfies a mechanical strength, and for example, when the substrate 2 has a diameter of about 50 mm (2 inches), the thickness of the substrate 2 is preferably 100 μm or more.

Step of Forming Membrane Electrode 3 and Dielectric Layer 4

Preferably, the membrane electrode 3 having a thickness of 5 μm or less is formed on the substrate 2, and the dielectric layer 4 having a thickness of 5 μm or less is formed on the surface of the membrane electrode 3. For the membrane electrode 3, an active metal such as titanium or yttrium, or a constituent element of the substrate 2 or the dielectric layer 4 is used; however, in the following description, a case of using yttrium is described as an example.

Figure 2:
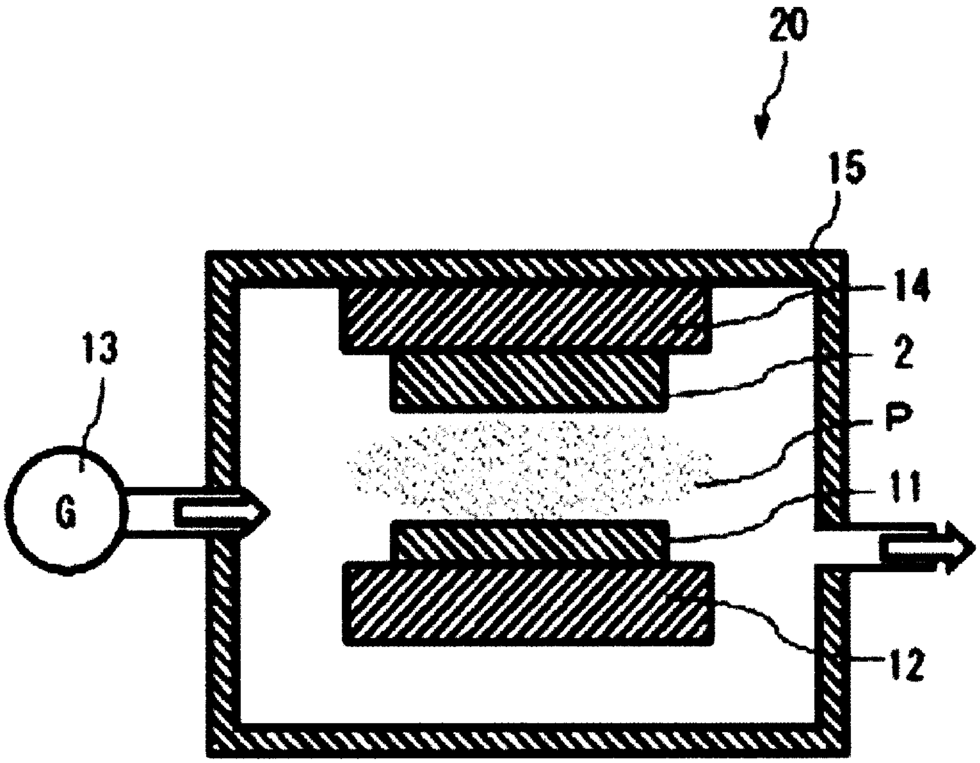
FIG. 2 is a schematic view illustrating a sputtering apparatus for manufacturing the plasma-resistant laminate.

A method for forming the membrane electrode 3 and the dielectric layer 4 is described with reference to FIG. 2. FIG. 2 is a schematic view illustrating a sputtering apparatus 20, and the sputtering apparatus 20 includes a chamber 15, a gas supply source 13 leading into the chamber 15, an anode electrode 14 and a cathode electrode 12 located inside the chamber 15, and a target 11 connected to the cathode electrode 12 side.

The membrane electrode 3 and the dielectric layer 4 can be continuously formed by the sputtering apparatus 20 capable of performing sputtering and plasma processing. First, the substrate 2 obtained by the method described above is installed on the anode electrode 14 side inside the chamber 15. On the opposite side of the chamber 15, that is, on the cathode 12 side, the target 11 having a purity of 4N (99.99%) or more and made of metal yttrium is installed. In this state, the inside of the chamber 15 is depressurized by an exhaust pump, and argon and oxygen are supplied as gas G from the gas supply source 13. For example, the pressure of the argon gas is from 0.1 Pa to 2 Pa, and the pressure of the oxygen gas is from 1 Pa to 5 Pa. In order to obtain the dielectric layer 4 in which the average value $\sigma 1$ of the stresses $\sigma 11$ and $\sigma 22$ in the two directions perpendicular to the thickness direction and orthogonal to each other is from 200 MPa to 1000 MPa, the pressure of the argon gas may be from 0.1 Pa to 1 Pa and the pressure of the oxygen gas may be from 1 Pa to 5 Pa.

Subsequently, in an argon-rich atmosphere, an electric field is applied between the anode electrode 14 and the cathode electrode 12 by a power source to generate a plasma P, and sputtering is performed, thereby forming a metal yttrium film on the surface of the substrate 2 and forming the membrane electrode 3 having a thickness of 5 μm or less. Power supplied from the power source may be either high-frequency power or direct current power. When the membrane electrode 3 is formed by laminating a plurality of metals such as titanium and yttrium, a plurality of targets 11 may be disposed in the sputtering apparatus 20, and a metal to be deposited may be switched by switching the target 11.

After the membrane electrode 3 is formed, the dielectric layer 4 is formed by a post- oxidation sputtering method. That is, by repeating the formation of a metal yttrium film by sputtering and oxidation by oxygen plasma on the surface of the membrane electrode 3, an yttria film serving as the dielectric layer 4 is formed. The thickness of the yttrium film formed once is about 1 nm or less. Subsequently, by alternately performing the formation of the yttrium film and the oxidation process so that the total thickness of the dielectric layer 4 is 5 μm or less, the dielectric layer 4 including yttria and having a thickness of 5 μm or less is obtained. Thus, the plasma-resistant laminate 1 of the present disclosure can be obtained. When the surface of the membrane electrode 3 is made of yttrium, a connection portion with the dielectric layer 4 can be formed by oxidizing the membrane electrode 3, so that the dielectric layer 4 that is stable and that has high adhesion is obtained. Such a boundary surface between the yttrium layer and the yttrium oxide is unclear, resulting in a region where an oxygen ratio continuously increases.

The sputtering apparatus 20 for alternately performing the sputtering step of forming the metal yttrium film and the oxidation step includes a type in which a sputtering region and an oxidation region are separated by space and the substrate 2 is moved between both regions, and a type in which sputtering and oxidation are separated by time and sputtering and oxidation are alternately performed in the same region. FIG. 2 illustrates the latter type.

In the former type, the sputtering region and the oxidation region are provided in the apparatus, and the substrate 2 is moved between these regions. Each region is surrounded by a partition wall, and in the sputtering region, Ar partial pressure is increased and ions are accelerated by a magnetic field (or an electric field) to collide with the target. On the other hand, oxygen partial pressure is increased in the oxidation region.

In the latter type, the substrate 2 remains at the same place, and the type of gas supplied into the chamber 15 is switched to repeat metal film formation and oxidation.

In any case, sputtering is performed by irradiating the target with argon-rich plasma in the sputtering region (during sputtering), and oxidation is performed by irradiating the films of the substrate 2 and the dielectric layer 4 with oxygen-rich plasma in the oxidation region (during oxidation).

As illustrated in FIG. 1, the dielectric layer 4 is formed to cover the surface and side surfaces of the membrane electrode 3. The reason the membrane electrode 3 is not exposed in this way is to protect the membrane electrode 3 from the plasma.

Figure 3A:
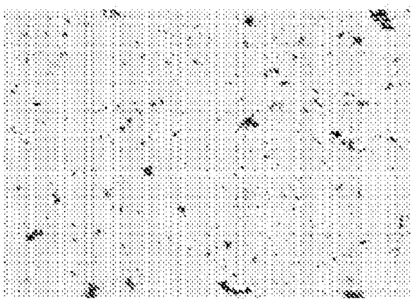
FIG. 3A is a laser microscope photograph (magnification: 1200 times) of a substrate on which a film was formed using sapphire.
Figure 3B:
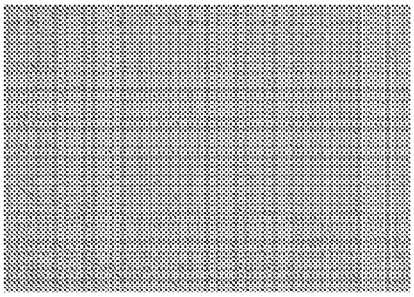
FIG. 3B is a laser microscope photograph (magnification: 1200 times) of a substrate on which a film was formed using alumina for comparison.

FIG. 3A illustrates a laser microscope photograph (magnification: 1200 times) obtained by observing the surface of the dielectric layer 4 formed on the substrate 2 made of sapphire. For comparison, FIG. 3B illustrates a laser microscope photograph (magnification: 1200 times) obtained by observing the surface of the dielectric layer 4 formed on a substrate made of alumina ceramic in the same manner. Note that the arithmetic mean height Sa of the substrate 2 made of sapphire after polishing was 10 nm or less, and the arithmetic mean height Sa of the substrate made of alumina was 30 nm or less.

While voids, scratches and the like appear on the surface of the dielectric layer 4 of the substrate made of alumina illustrated in FIG. 3B, no voids, scratches and the like are observed on the surface of the dielectric layer 4 on the substrate 2 made of sapphire illustrated in FIG. 3A.

While the surface of the dielectric layer 4 on the substrate made of alumina has an arithmetic mean height Sa of 0.199 μm, the surface of the dielectric layer 4 on the substrate 2 made of sapphire has an arithmetic mean height Sa of 0.032 μm and is smooth. Therefore, by using the substrate 2 made of sapphire, the membrane electrode 3 and the dielectric layer 4 that are thin and free from voids or the like can be formed.

Figure 4A:
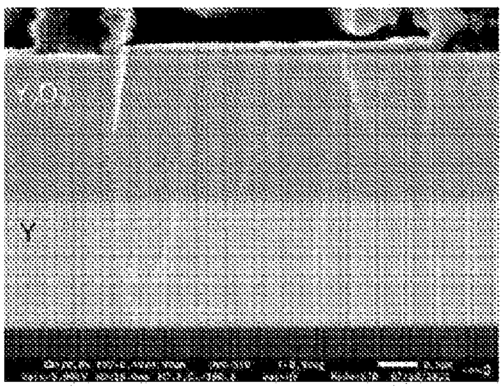
FIG. 4A is a scanning electron microscope (SEM) photograph showing an interface portion between a membrane electrode and a dielectric layer at a center portion.
Figure 4B:
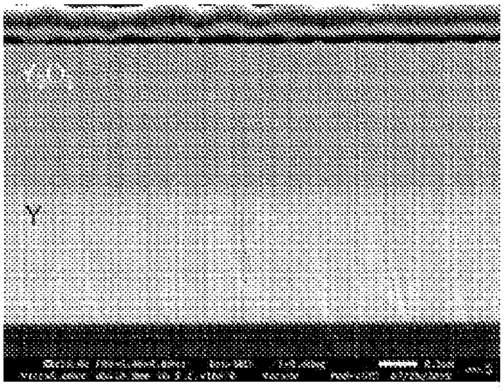
FIG. 4B is a scanning electron microscope (SEM) photograph showing an interface portion between a membrane electrode and a dielectric layer at an outer peripheral portion.

FIGS. 4A and 4B are scanning electron microscope (SEM) photographs showing an example of the layered state of the formed membrane electrodes 3 and dielectric layers 4, and show interface portions at a center portion and an outer peripheral portion, respectively. In the plasma-resistant laminate 1 illustrated in FIGS. 4A and 4B, the dielectric layer 4 having a thickness of about 2 μm and made of yttria ($Y_2O_3$) is formed on the membrane electrode 3 formed on the substrate 2 made of sapphire, the membrane electrode 3 having a thickness of about 2 μm and made of yttrium (Y).

It can be seen from FIGS. 4A and 4B that the membrane electrodes 3 and the dielectric layers 4 are uniformly layered over the entire surface. An amorphous intermediate layer exists between the membrane electrode 3 made of yttrium and the dielectric layer 4 made of yttria. The intermediate layer has an intermediate composition between yttria and yttrium, and contributes to improvement in adhesion between the membrane electrode 3 and the dielectric layer 4.

The support layer 5 may be bonded to the substrate 2 in advance before sputtering, or may be bonded after sputtering.

The plasma-resistant laminate 1 of the present disclosure is used for capacitive probe type plasma sensors. That is, in a plasma processing apparatus for performing plasma processing on an object to be processed such as a semiconductor substrate by using plasma discharge, such as plasma CVD, ashing, etching, or sputtering, one or more of the above plasma sensors are attached to a wall surface in a plasma processing chamber for use. Other applications of the plasma-resistant laminate 1 include an electrostatic chuck and the like.

The plasma-resistant laminate 1 of the present embodiment has excellent plasma resistance because the substrate 2 includes sapphire and the dielectric layer 4 includes an oxide (yttria) of yttrium. Since the difference in thermal expansion between sapphire and yttria is small, peeling or cracking due to thermal stress is unlikely to occur. Sapphire has excellent mechanical strength. Consequently, the plasma-resistant laminate 1 of the present embodiment can be suitably used for a plasma measuring instrument in a plasma processing apparatus.

The embodiment of the present disclosure has been described above; however, the plasma-resistant laminate of the present disclosure is not limited to the above embodiment and various changes and improvements can be made within the scope of the present disclosure. For example, the substrate 2 may include, in sapphire, an additive or oxygen defect for adjusting the transmittance of light, for example, an additive or defect that absorbs light harmful to the surroundings, such as ultraviolet light, as long as the characteristics of the substrate 2 are not impaired. The dielectric layer 4 may include another oxide such as aluminum in addition to yttrium, or may include a composite oxide such as yttrium aluminum garnet as long as the characteristics of the dielectric layer 4 are not impaired.

REFERENCE SIGNS

1 Plasma-resistant laminate
2 Substrate
3 Membrane electrode
4 Dielectric layer
5 Support layer
6 Via electrode
7 Power supply terminal
11 Target
12 Cathode
13 Gas supply source
14 Anode
15 Chamber
20 Sputtering apparatus

The invention claimed is:

1. A plasma-resistant laminate comprising:
- a substrate;
- a membrane electrode located on the substrate; and
- a dielectric layer located on the membrane electrode, wherein
- the substrate comprises sapphire,
- the dielectric layer comprises an oxide comprising yttrium, and the membrane electrode comprises an active metal, a constituent element of the substrate or the dielectric layer, or a laminate thereof,
- wherein the substrate comprises a via electrode electrically connected to the membrane electrode, and a step between the via electrode and the substrate is 1.0 μm or less.

2. The plasma-resistant laminate according to claim 1, wherein the membrane electrode is a laminate of the active metal on the substrate and yttrium on the active metal.

3. The plasma-resistant laminate according to claim 1, wherein the membrane electrode has a thickness of 5 um or less, and the dielectric layer has a thickness of 5 um or less from a surface of the membrane electrode and an area of 1000 $mm^2$ or more.

4. The plasma-resistant laminate according to claim 1, wherein a capacitance, expressed as "area×dielectric constant/thickness" of the dielectric layer on the membrane electrode, is equal to or greater than 1 nF.

5. The plasma-resistant laminate according to claim 1, wherein the membrane electrode comprises titanium, yttrium, or a laminate thereof.

6. The plasma-resistant laminate according to claim 5, wherein the membrane electrode is a laminate of a titanium layer on the substrate and an yttrium layer on the titanium layer.

7. The plasma-resistant laminate according to claim 1, wherein the dielectric layer has a compressive stress in a direction perpendicular to a thickness direction and has a direction in which a shape of the substrate is long and a direction in which the shape of the substrate is short, and the direction in which the shape of the substrate is long is parallel to a c-axis of sapphire.

8. A plasma-resistant laminate comprising:
- a substrate;
- a membrane electrode located on the substrate; and
- a dielectric layer located on the membrane electrode, wherein
- the substrate comprises sapphire,
- the dielectric layer comprises an oxide comprising yttrium, and
- the membrane electrode comprises an active metal, a constituent element of the substrate or the dielectric layer, or a laminate thereof,
- wherein the dielectric layer has compressive stresses $\sigma 11$ and $\sigma 22$ in two directions perpendicular to a thickness direction of the dielectric layer and orthogonal to each other are both compressive stresses, and $\sigma 22/\sigma 11$ is from 0.5 to 2.

9. The plasma-resistant laminate according to claim 8, wherein the $\sigma 22/\sigma 11$ is from 0.8 to 1.2.

10. The plasma-resistant laminate according to claim 8, wherein an average value $\sigma 1$ of the stresses $\sigma 11$ and $\sigma 22$ in the two directions perpendicular to the thickness direction of the dielectric layer and orthogonal to each other is a compressive stress from 200 MPa to 1000 MPa.

11. A plasma-resistant laminate comprising:
- a substrate;
- a membrane electrode located on the substrate; and
- a dielectric layer located on the membrane electrode, wherein
- the substrate comprises sapphire,
- the dielectric layer comprises an oxide comprising yttrium, and the membrane electrode comprises an active metal, a constituent element of the substrate or the dielectric layer, or a laminate thereof,
- wherein the dielectric layer has a compressive stress in a direction perpendicular to a thickness direction, and a surface of the substrate is a c-plane of sapphire.

12. A method for manufacturing the plasma-resistant laminate according to claim 1, the method comprising:
- polishing a surface of the substrate so that an arithmetic mean height Sa is 10 nm or less;
- forming the membrane electrode on the substrate; and
- forming the dielectric layer by repeating film formation and oxidation of a metal material.

13. The method for manufacturing the plasma-resistant laminate according to claim 12, wherein the membrane electrode has a thickness of 5 μm or less and the dielectric layer has a thickness of 5 μm or less.

14. A plasma processing apparatus in which a plasma sensor comprising the plasma-resistant laminate according to claim 1 is mounted in a plasma processing chamber.

* * * * *